United States Patent [19]

Legge

[11] Patent Number: 4,706,870
[45] Date of Patent: Nov. 17, 1987

[54] CONTROLLED CHEMICAL REDUCTION OF SURFACE FILM

[75] Inventor: Ronald N. Legge, Scottsdale, Ariz.

[73] Assignee: Motorola Inc., Schaumburg, Ill.

[21] Appl. No.: 921,838

[22] Filed: Oct. 23, 1986

Related U.S. Application Data

[63] Continuation of Ser. No. 682,863, Dec. 18, 1984, abandoned.

[51] Int. Cl.$^4$ ............................................. B23K 31/02
[52] U.S. Cl. .................................... 228/123; 228/205
[58] Field of Search ............... 228/203, 205, 206, 207, 228/123, 124, 220

[56] References Cited

U.S. PATENT DOCUMENTS

| | | | |
|---|---|---|---|
| 3,182,118 | 5/1965 | Proost | 228/123 |
| 3,665,590 | 5/1972 | Percival | 228/220 |
| 3,769,688 | 11/1973 | Kessler | 228/123 |
| 4,245,768 | 1/1981 | Sater | 228/205 |
| 4,305,200 | 12/1981 | Fu | 29/571 |
| 4,343,830 | 8/1982 | Sarma | 427/38 |
| 4,379,218 | 5/1983 | Grebe | 228/205 |

FOREIGN PATENT DOCUMENTS 424681 3/1972 U.S.S.R. ............................... 228/123

OTHER PUBLICATIONS

NASA Technical Memorandum, NASA TM-78933 by Sater et al.—"The Use of Ion Beam Cleaning to Obtain High Quality Cold Welds with Minimal Deformation".
"Basic Electrical Engineering" by Fitzgerald et al., 5th ed., pp. 374 and 377.

Primary Examiner—Nicholas P. Godici
Assistant Examiner—G. Reid
Attorney, Agent, or Firm—Raymond J. Warren

[57] ABSTRACT

A process is disclosed for applying an electrical contact to the surface of a semiconductor device. A layer of metal selected from metals such as nickel, silver, copper, or alloys of these metals contacts a selected surface region of the device. A metallic contact is then soldered or otherwise joined to the layer of metal. To facilitate the joining, any native oxide present on the surface of the metal layer is first reduced by the low energy implantation of hydrogen ions into the metal surface.

10 Claims, 2 Drawing Figures

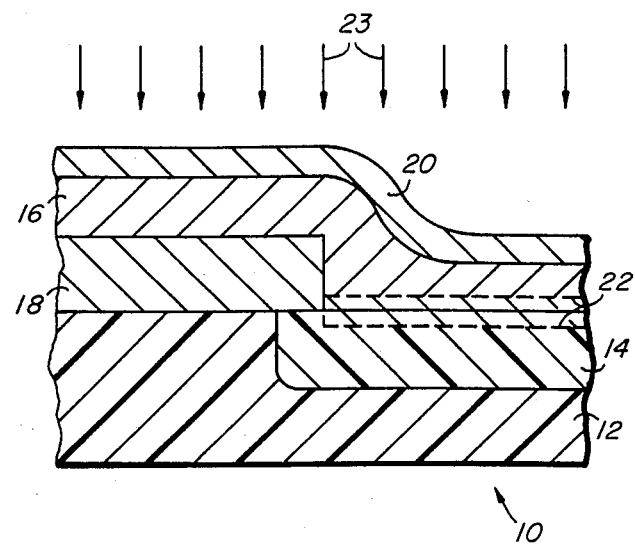
FIG. 1
FIG. 2
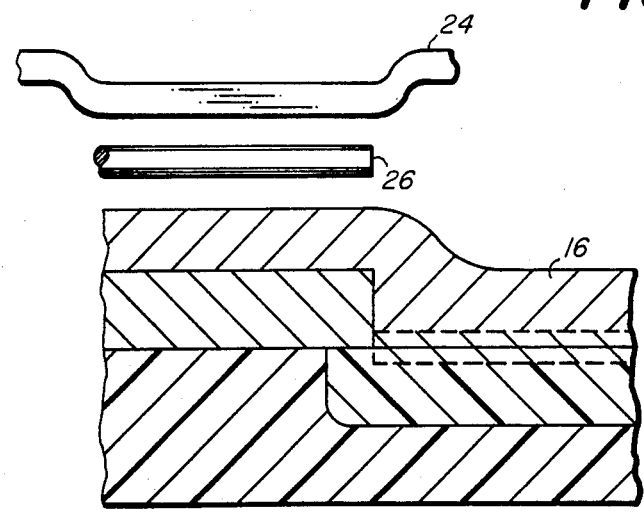

CONTROLLED CHEMICAL REDUCTION OF SURFACE FILM

This application is a continuation, of application Ser. No. 682,863, filed Dec. 18, 1984; now abandoned.

BACKGROUND OF THE INVENTION

This invention relates generally to the controlled chemical reduction of surface films, and more specifically, to a process for removing a native film from a metal surface so that another metal can be joined to that surface.

In the process of joining two metallized objects, such as by soldering, welding, or the like, a film of metallic oxide on the surface of one of the metallized objects can impede the process of joining. The metal oxide can totally prevent the joining, make the joining unreliable, or make the use of flux or other material or process necessary to effect an acceptable joining. For example, when soldering to a nickel surface, a nickel oxide layer provides such an impediment. Because nickel oxidizes very readily and rapidly upon exposure to air, soldering to nickel is difficult because of the almost omnipresent oxide layer. Soldering to nickel is, therefore, usually accomplished by using a soldering flux, by high temperature reduction of the oxide in a hydrogen ambient, or by other techniques for reducing the oxide layer.

In the fabrication of semiconductor devices, for example, it is often necessary to join a metallized semiconductor die to a metallized package or to join an electrical lead to a metallized region on the surface of the semiconductor device. The joining can be by soldering or by one of the bonding techniques such as ultrasonic or thermo-compression bonding. In any of these joining techniques the presence of an oxide layer on the metal surface impedes the joining. The very nature of semiconductor devices, as well as the nature of many other structures, limits the use of standard techniques for reducing the oxide prior to joining. For example, many semiconductor devices involve very shallow device regions which would be adversely affected by high temperature reduction techniques. Large area devices such as photovoltaic cells are too large and to fragile to permit the use of solder fluxes since the size of the device makes the proper cleanup of the device difficult is not impossible. Additionally, the use of flux with any device entails additional processing steps, including cleanup, which significantly add to the cost of the device. Maintaining a controlled reducing atmosphere is expensive, requiring large quantities of gases as well as equipment.

A need therefore existed for a process which would overcome the deficiencies of the prior art processes to allow the joining of metallic parts.

It is therefore an object of this invention to provide an improved process for applying an electrical contact to a semiconductor device.

It is another object of this invention to provide an improved process for fabricating a photovoltaic cell.

It is yet another object of this invention to provide an improved process for bonding together metal objects.

It is a further object of this invention to provide an improved process for removing an oxide layer or other native film layer from a metallized surface prior to soldering.

BRIEF SUMMARY OF THE INVENTION

The foregoing and other objects and advantages are achieved in accordance with a process which utilizes the ion implantation of reducing ions into the surface of a metal layer. In one embodiment of the invention an electrical contact is applied to the surface of a semiconductor device by forming a layer of metal contacting the surface. Hydrogen ions are implanted into the surface of that metal layer to reduce any oxides formed thereon, and then a metallic contact is soldered to the layer of metal.

BRIEF DESCRIPTION OF THE DRAWING

FIGS. 1 and 2 illustrate, in cross section, a portion of a semiconductor device and the joining of a metal contact thereto in accordance with the invention.

DETAILED DESCRIPTION OF PREFERRED EMBODIMENTS

FIG. 1 illustrates, in cross section, a portion of a semiconductor device 10 during processing of that device. Semiconductor device 10 includes a substrate 12 in which device regions 14 of opposite conductivity type are formed. Device 10 may be, for example, a discrete transistor, diode, photovoltaic cell, or an integrated circuit. In order to operate the device, electrical contact must be made to device region 14. To achieve the electrical contact, a metal layer 16 is applied to the device surface in contact with region 14. Undesired contact to other parts of the device structure is prevented by a patterned insulation layer 18. In accordance with the invention, metal layer 16 can be, for example, nickel, silver, copper, or alloys of these materials. Additionally, metal layer 16 can be any other metal or alloy which forms an easily reducible chemical compound such as a metal oxide on its surface upon exposure of the metal to the ambient. The presence of an oxide or other compound on a metal surface is indicated by the layer 20. Depending on the metal used and the structure, contact metal 16 may be evaporated, sputtered, plated, or otherwise applied in known manner.

Although layer 20 is referred to as a layer of metal oxide, the invention is also applicable to the reduction of other metal compounds. Accordingly, as used herein, the terms "oxide" and "metal oxide" will be used to refer to any native metal compound film formed on the metal surface.

To insure good electrical contact to device region 14, it may be necessary in certain device structures to form an additional contact layer between metal 16 and region 14. This additional contact metal layer is indicated by the dash lines 22. The additional contact layer can be, for example, platinum silicide, palladium silicide, or the like, which is formed by depositing platinum or palladium on a silicon device surface and then heating to form the silicide or by direct deposition of the silicide on the surface regardless of substrate type. Alternatively, a first contact metal or barrier metal can be deposited on the surface of region 14 before contact metal 16 is applied. A contact metal such as nickel has a tendency to rapidly form a nickel oxide layer 20 on its surface. For example, nickel oxide can form on a freshly plated electroless nickel surface in a matter of minutes upon exposure to room air. Such a layer of oxide interferes with reliable bonding where the bonding involves joining a metal wire or other conductor to metal 16 by soldering, thermocompression bonding, ultrasonic bonding, welding, or the like. For optimum bonding, the two metal surfaces to be joined must be clean and free from oxides or other metallic compounds.

In accordance with the invention, the oxide layer is removed by implanting the surface of the metal, including the oxide layer, with hydrogen ions as indicated schematically by arrows 23. The hydrogen ions act to reduce the oxide layer and are effective with oxide layers on nickel, silver, copper, and alloys thereof, as well as other materials having easily reducible oxides. The technique in accordance with the invention, however, has not been found applicable to oxides of either aluminum or silicon, since these oxides are apparently difficult to reduce.

As illustrated in FIG. 2, after ion implanting metal 16 with hydrogen ions to reduce any oxide layer formed on the surface of the metal, a conductor 24 can be soldered to metal 16 using a conventional solder 26. The soldering can be carried out at low temperatures without a reducing ambient and without using a flux. Conventional lead-tin solder such as 60:40, for example, can be used to solder a nickel clad lead 24 to nickel metallization 16.

The reduction process, in accordance with the invention, requires a high dose of reducing ions, and preferably hydrogen ions. In the case of reducing a metal oxide, the dose must be sufficiently high to supply about 2 hydrogen ions for each oxygen atom associated with the metal oxide molecule. A high flux of hydrogen ions, of the order of $10^{17}$ per square centimeter, can easily be supplied by low energy, unanalyzed hydrogen ion beams. The ion implant voltage should be about 5 Kv or less and is preferably about 1–2 Kv. The relatively low energy ions are optimum for the reaction since the oxide to be reduced is a surface oxide and the low energy ions have a shallow range and are stopped near the surface.

In accordance with the invention, a photovoltaic cell was fabricated by forming a shallow N-type region near the surface of a P-type silicon wafer to form a PN junction. An antireflective coating was formed on the surface of the N-type region and patterned to allow the N-type region to be selectively contacted. Contact to the N-type region was made by plating palladium onto portions of the N-type region exposed through openings in the antireflective coating. The palladium was sintered to form palladium silicide contacting the N-type region. Electroless nickel was then plated onto the palladium silicide to a thickness of about 150 nanometers. In accordance with the invention, selected photovoltaic cells were ion implanted with hydrogen at about 1 Kv and a dose of about $5 \times 10^{17}$ per square centimeter. No heating of the photovoltaic cell was observed during the ion implantation. Solder coated leads were then soldered to the electroless nickel by heating in an inert ambient to a temperature of about 225° C. It was observed that the soldering operation could be carried out as much as 24 hours after the ion implantation without any impediments to the soldering. Other photovoltaic cells which did not receive the ion implantation could not be soldered even minutes after the electroless nickel plating under the low temperature soldering conditions above. Only by heating the cells to a temperature greater than or equal to 245° C. in a hydrogen ambient for more than 15 minutes could the soldering be properly carried out. The extended high temperature hydrogen treatment, however, is sufficient to form a nickel silicide and to diffuse nickel into the silicon. Because of the shallow junctions utilized in photovoltaic cells, the nickel diffusion adversely affects the PN junction and thus the performance of the photovoltaic cell.

Silver plated substrates were prepared having a bright, metallic-looking surface. After exposure to room ambient, the silver surface tarnished and assumed a grayish color. The substrates were ion implanted with hydrogen at 2 Kv to a dose of about $2 \times 10^{17}$ cm$^{-2}$. After the implantation the surfaces were again characterized by the original bright, metallic-looking appearance. Soldering to the surface was achieved in an inert ambient without the use of a soldering flux.

Thus it is apparent that there has been provided, in accordance with the invention, an improved process for reducing oxides on the surface of metals, for joining metals together, and for forming semiconductor devices which fully meets the objects and advantages set forth above. Although the invention has been described and illustrated with reference to specific embodiments thereof such as the fabrication of specific semiconductor devices, it is not intended that the invention be limited to these illustrative embodiments. In the fabrication of semiconductor devices, for example, nickel plated packages or lead frames are often employed. The invention can be used to reduce oxides on these packages or lead frames before attaching a semiconductor die thereto. Additionally, silver or copper is often used as a metallization on the back of semiconductor die for use in attaching that die to a metallic package member. The invention may be employed to prepare those back metal surfaces prior to die attachment. Additionally, the invention applies to other industries than the semiconductor industry. Further, it is contemplated that the low voltage ion implantation can be implemented by the use of high pressure plasma equipment such as that described in U.S. Pat. No. 4,343,830. Hydrogen can be supplied to the reaction as pure hydrogen, as a mixture including hydrogen or as a gaseous hydrogen compound. Accordingly, it is intended to include within the invention all such variations which fall within the scope of the appended claims.

I claim:

1. A process for applying an electrical contact to the surface of a semiconductor device which comprises the steps of:

forming a layer of metal contacting said surface, said metal selected from metals having an easily reducible oxide; implanting ions consisting solely of hydrogen ions into said layer of metal to reduce any oxides formed thereon without substantially heating said layer of metal; and soldering a metallic contact to said layer of metal.

2. The process of claim 1 wherein said metal is selected from the group consisting of nickel, copper, silver, and alloys thereof.

3. The process of claim 1 wherein said hydrogen ions are implanted at a voltage of less than about 5 Kv.

4. The process of claim 1 wherein more than $10^{17}$ hydrogen ions per square centimeter are implanted.

5. The process of claim 2 wherein said metal comprises nickel and said step of soldering comprises use of a lead-tin solder.

6. The process of claim 5 wherein said step of soldering comprises soldering in an inert ambient.

7. A process for fabricating a photovoltaic cell which comprises the steps of: providing a semiconductor substrate of a first conductivity type and having a surface; forming at said surface a region of opposite conductivity type to form a PN junction; selectively forming contact metallization contacting portions of said region; forming a nickel film overlying said contact metallization; implanting ions consisting solely of hydrogen ions into a surface layer of said nickel film at a current and energy to avoid heating of said nickel film; and soldering a metal electrode to said nickel film.

8. The process of claim 7 wherein said contact metallization comprises a metal silicide.

9. The process of claim 8 wherein said metal silicide comprises platinum silicide.

10. The process of claim 8 wherein said metal silicide comprises palladium silicide.

* * * * *